United States Patent
Schneller et al.

(10) Patent No.: US 12,464,856 B2
(45) Date of Patent: Nov. 4, 2025

(54) METALLIZATION PATTERNS FOR PHOTOVOLTAIC CELLS

(71) Applicant: SILFAB INC., Mississauga (CA)

(72) Inventors: Eric Schneller, Bellingham, WA (US); Paolo Dilorenzo, Leuven (BE); Mahyar Mohammadnezhad, North York (CA); Michael Duane Alexander, Custer, WA (US); Itai Suez, Georgetown (CA)

(73) Assignee: SILFAB INC., Mississauga (CA)

( * ) Notice: Subject to any disclaimer, the term of this patent is extended or adjusted under 35 U.S.C. 154(b) by 79 days.

(21) Appl. No.: 18/555,370

(22) PCT Filed: Apr. 13, 2022

(86) PCT No.: PCT/IB2022/053492
§ 371 (c)(1),
(2) Date: Oct. 13, 2023

(87) PCT Pub. No.: WO2022/219568
PCT Pub. Date: Oct. 20, 2022

(65) Prior Publication Data
US 2024/0047585 A1 Feb. 8, 2024

Related U.S. Application Data

(60) Provisional application No. 63/174,593, filed on Apr. 14, 2021.

(51) Int. Cl.
*H10F 77/00* (2025.01)
*H10F 71/00* (2025.01)
*H10F 77/20* (2025.01)

(52) U.S. Cl.
CPC .......... *H10F 77/935* (2025.01); *H10F 71/00* (2025.01); *H10F 77/219* (2025.01)

(58) Field of Classification Search
CPC ....... H10F 77/935; H10F 77/219; H10F 71/00
See application file for complete search history.

(56) References Cited

U.S. PATENT DOCUMENTS

| 6,573,445 B1 | 6/2003 | Burgers |
| 8,796,534 B2 | 8/2014 | Van Roosmalen |
| (Continued) | | |

FOREIGN PATENT DOCUMENTS

| CN | 208077988 U | 11/2018 |
| CN | 209344083 U | 9/2019 |
| (Continued) | | |

OTHER PUBLICATIONS

H. B. Serreze, "Optimizing SC performance by simultaneous consideration of grid pattern design and interconnect configuration", Conference Record of the IEEE Photovoltaic Specialists Conference . Jan. 1978. (Year: 1978).*

(Continued)

*Primary Examiner* — Tae-Sik Kang
(74) *Attorney, Agent, or Firm* — DLA Piper LLP (US)

(57) ABSTRACT

An example of an apparatus to convert light energy to electrical energy is provided. The apparatus includes a semiconductor material to absorb energy from a photon. The energy is to be converted to a current. Furthermore, the apparatus includes a positive electrode disposed on a backside of the semiconductor material to collect the current from the backside. In addition, the apparatus includes a via to connect the backside of the semiconductor material electrically to a frontside of the semiconductor material. The apparatus also includes a plurality of fingers disposed on the frontside of the semiconductor material to collect the current from the frontside. The apparatus further includes a trunkline connected to the plurality of fingers to deliver the (Continued)

current to the via. The trunkline is to increase a cross-sectional area toward the via to reduce parasitic resistance.

9 Claims, 13 Drawing Sheets

(56) References Cited

U.S. PATENT DOCUMENTS

| | | | |
|---|---|---|---|
| 9,537,018 B2 | 1/2017 | Bende | |
| 2012/0273022 A1* | 11/2012 | Van Roosmalen | ... H10F 77/215 136/244 |
| 2014/0166102 A1 | 6/2014 | Bende | |

FOREIGN PATENT DOCUMENTS

| | | |
|---|---|---|
| CN | 209544365 U | 10/2019 |
| CN | 209658193 U | 11/2019 |
| CN | 209658194 U | 11/2019 |
| WO | 2019/039942 | 2/2019 |

OTHER PUBLICATIONS

H.B. Serreze, "Optimizing SC performance by simultaneous consideration of grid pattern design and interconnect configuration", IEEE Photovoltaic Specialists Conference . Jan. 1978. (Year: 1978).*

PCT International Application No. PCT/IB22/53492, International Search Report and Written Opinion of the International Searching Authority, dated Sep. 7, 2022, 7 pages.

Serreze, "Optimizing solar cell performance by simultaneous consideration of grid pattern design and interconnect configuration," 13th IEEE PVSC, 1978 609, 1978, pp. 609-614.

Bissels, et al. "A new circular contact grid pattern, designed for solar cells in a mechanical stack," 2010 35th IEEE Photovoltaic Specialists Conference, 2010, pp. 2002-2006.

* cited by examiner

METALLIZATION PATTERNS FOR PHOTOVOLTAIC CELLS

CROSS-REFERENCE TO RELATED APPLICATION

This application is the National Stage filing under 35 U.S.C. 371 of International Application No. PCT/IB2022/053492, filed Apr. 13, 2022, which claims priority to U.S. Provisional Patent Application No. 63/174,593, filed Apr. 14, 2021, which are both incorporated by reference in their entireties.

BACKGROUND

Photovoltaic cells are electrical devices that collect light energy to convert to electricity. Photovoltaic cells are made from semiconductor materials connected to an electrical circuit through various contacts. In general, the contacts are metallic and cover the frontside surface of the photovoltaic cell to collect current from across all areas of the semiconductor material. However, by depositing metal on the frontside also shades the semiconductor material resulting in a decrease the amount of light entering the photovoltaic cell. Accordingly, various configurations of the metal contacts have been used to increase the efficiency of current collection while reducing shading.

One such configuration includes the use of photovoltaic cells with both electrical contacts on the backside that does not face the light source. A benefit of this configuration is the positioning of the electrical interconnections is not on the side exposed to the light source, allowing for a higher conductive cross-section. In such a configuration, current passes from the frontside to the backside using vias that connect the frontside surface to the backside surface where the electrical interconnects are disposed.

SUMMARY

In accordance with an aspect of the invention, an apparatus is provided. The apparatus includes a semiconductor material to absorb energy from a photon. The energy is to be converted to a current. The apparatus further includes a positive electrode disposed on a backside of the semiconductor material to collect the current from the backside. In addition, the apparatus includes a via to connect the backside of the semiconductor material electrically to a frontside of the semiconductor material. The apparatus also includes a plurality of fingers disposed on the frontside of the semiconductor material to collect the current from the frontside. Also, the apparatus includes a trunkline connected to the plurality of fingers to deliver the current to the via. The trunkline increases a cross-sectional area toward the via to reduce parasitic resistance.

A variation of the cross-sectional area may maintain a substantially constant current density in the trunkline. The cross-sectional area may vary as a non-linear function with distance from the via. In particular, the non-linear function may parabolic.

A finger of the plurality of fingers may increase a finger cross-sectional area toward the trunkline to reduce parasitic resistance. In particular, a variation of the finger cross-sectional area may maintain a substantially constant current density in the finger. The finger cross-sectional area may vary as a finger non-linear function with distance from the trunkline along the finger. The finger non-linear function is parabolic.

The plurality of fingers may be disposed in a pattern to reduce a pathway distance to the via. The pattern may include each finger of the plurality of fingers disposed at an angle relative to the trunkline. In particular, the angle may be about 45 degrees.

BRIEF DESCRIPTION OF THE DRAWINGS

Reference will now be made, by way of example only, to the accompanying drawings in which.

DETAILED DESCRIPTION

Figure 1:
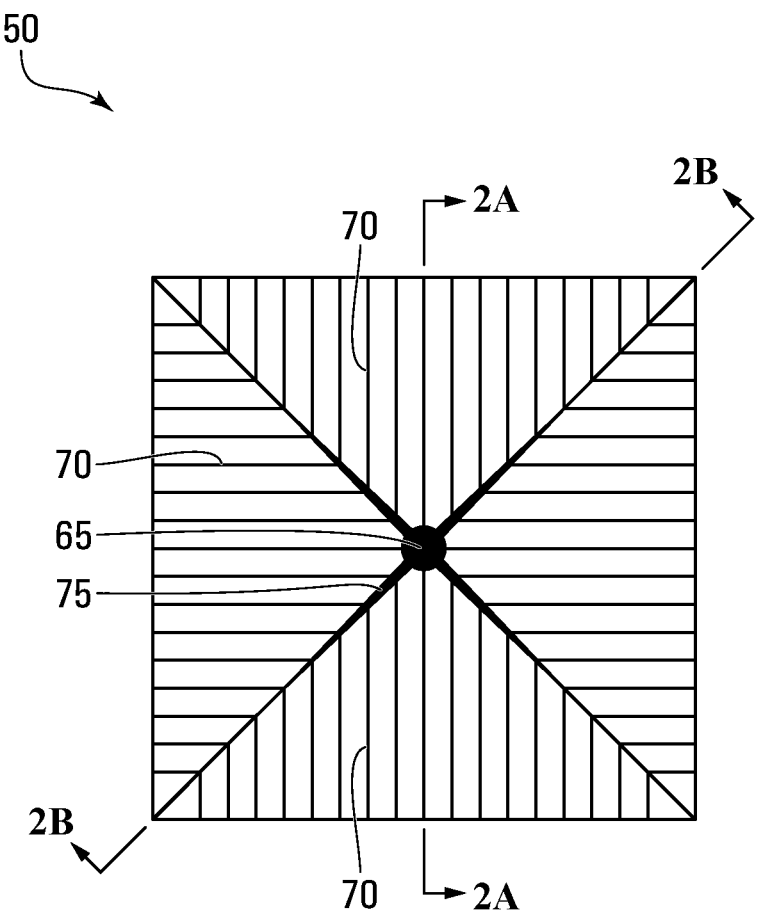
FIG. 1 is a view of an example of an apparatus to convert light energy to electrical energy.

In describing the components of the device and alternative examples of some of these components, the same reference number may be used for elements that are the same as, or similar to, elements described in other examples. As used herein, any usage of terms that suggest an absolute orientation (e.g. "top", "bottom", "front", "back", etc.) are for illustrative convenience. Such terms are not to be construed in a limiting sense as it is contemplated that various components will, in practice, be utilized in orientations that are the same as, or different than those described or shown.

Emitter wrap through and metal wrap through photovoltaic cells with back contacts are known. In general, the emitter wrap through and metal wrap through photovoltaic cells are built on the engine of both n-type and p-type mono-crystalline silicon (c-Si) solar cells using designs prior to PERC (passivated emitter rear contact) and SE (selective emitter) technologies. The design of the frontside metallization patterns are limited only by screen printing technologies which may be fairly complex in order to efficiently deliver the photocurrent from all the areas of the photovoltaic cell to the vias where the emitter is wrapped through to the backside of the cell. These types of designs may feature leaf-like veins radially emanating outward from the vias.

As the solar cell engine transitioned to a PERC design in combination with more complex LDSE (laser-doped selective emitter) processes, there are fundamental limitations in the complexity of the frontside metallization pattern that the laser tools can achieve to properly dope and align the emitter regions to the frontside metallization. As a result, metal wrap through designs have been aesthetically lackluster and more non-optimized for efficient transport of generated current to the vias.

An apparatus is provided to reduce a current density bottleneck that may occur as the frontside metallization pattern delivers current to the vias. As more current is added to the metallization pattern, it is to be appreciated by a person of skill in the art with the benefit of this description, that the current density being carried by the finger or trunkline increases. The increased current density may lead to an increase of the overall parasitic resistance as the current moves closer to the vias. Accordingly, the apparatus addresses this issue by using a frontside metallization pattern that decreases the length of the current pathway from a frontside location. In addition, the frontside metallization pattern may vary the cross-sectional area of the pattern of the trunklines and/or fingers, such as by a parabolic or other non-linear function, to maintain a substantially constant current density from regions further from the via to regions proximate to the via. By reducing the variation of the current density, parasitic resistive losses are reduced. In some examples, the variation of the cross-sectional can be designed without increasing the percentage of the solar cell which is shaded by the metallization to increase cell efficiency without consuming more paste. Likewise, fingers/trunklines can be made taller and narrower (matching cross-sectional area) to further decrease shading losses without compromising the substantially constant current density toward the vias.

Figure 2A:
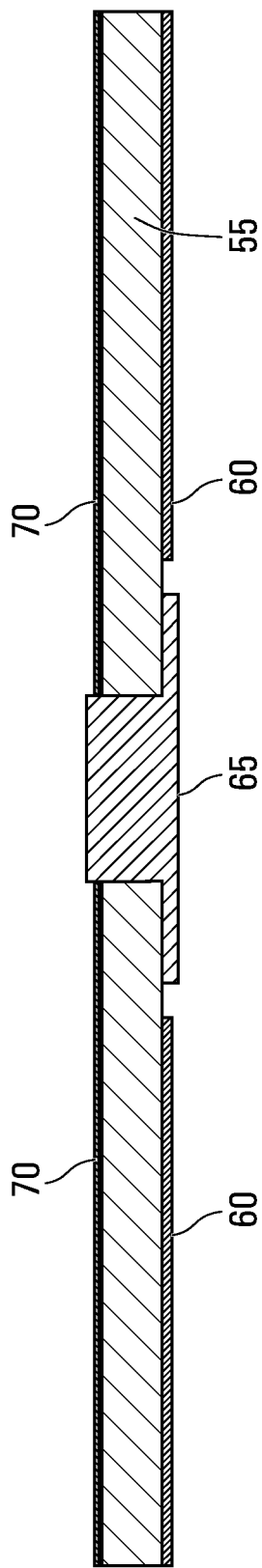
FIG. 2A is a cross-section view of the example apparatus of FIG. 1 through the line 2A-2A.
Figure 2B:
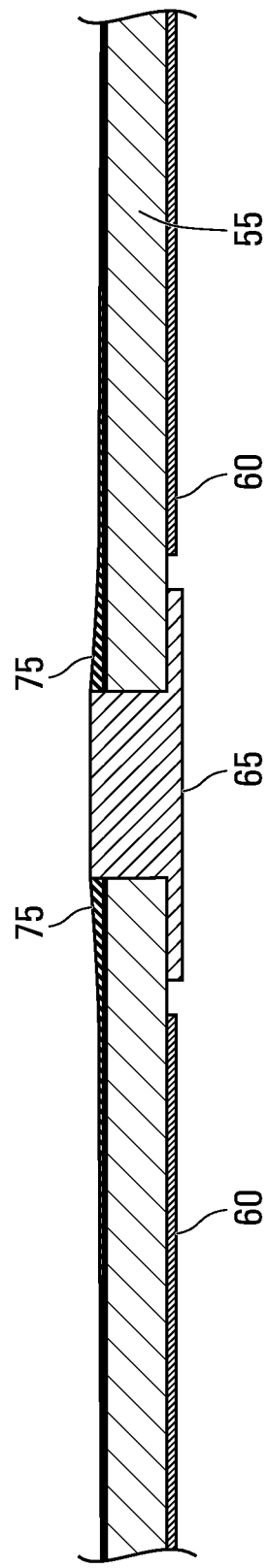
FIG. 2B is a cross-section view of the example apparatus of FIG. 1 through the line 2B-2B.
Figure 3:
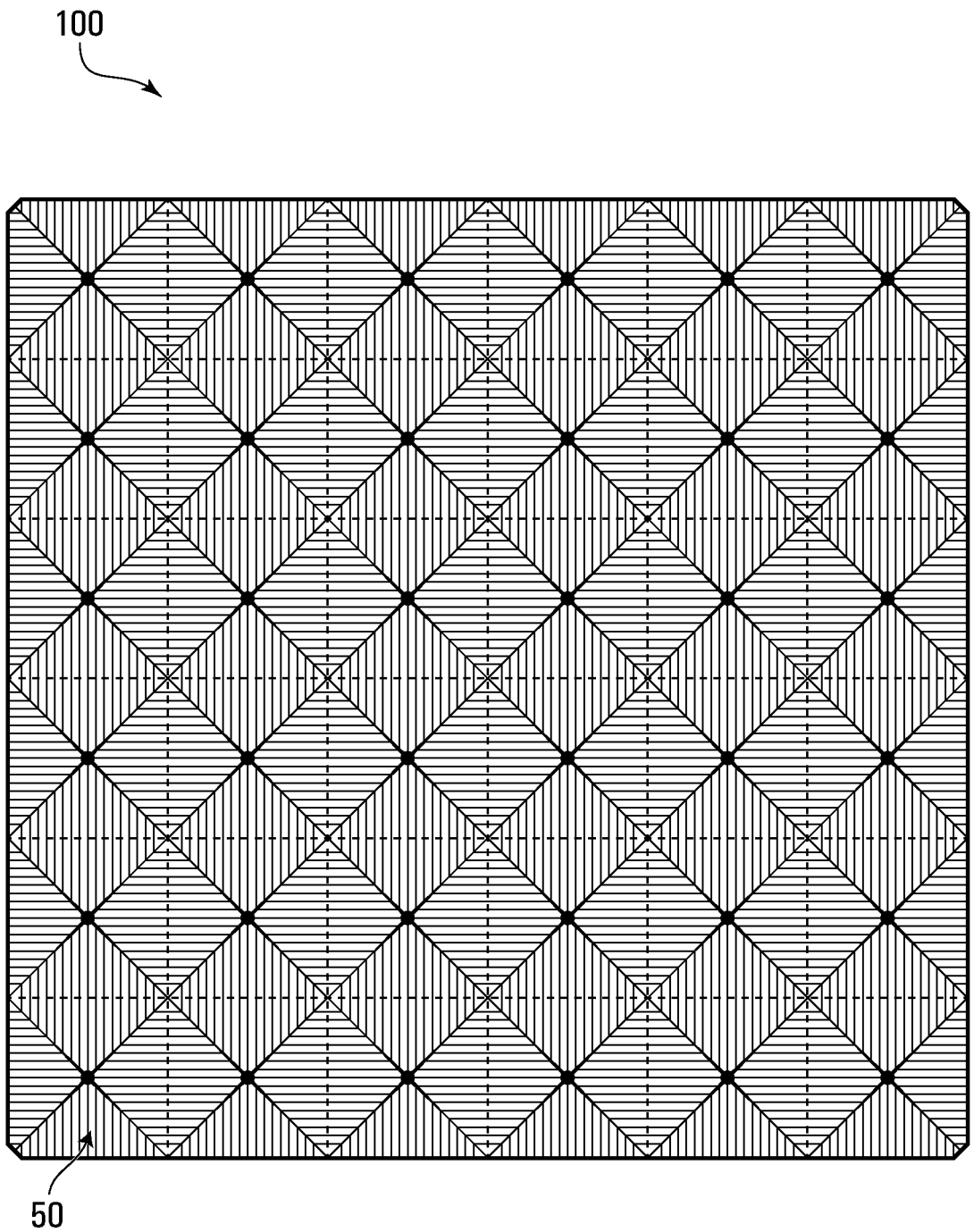
FIG. 3 is a view of a frontside of an example of a semiconductor wafer with multiple iterations of the apparatus shown in FIG. 1.

Referring to FIGS. 1, 2A, and 2B, a representation of an apparatus to convert light energy to electrical energy is generally shown at 50. The apparatus 50 may be part of a larger cell with a plurality of vias 65 to convert light energy. The present example shows a single unit which may be replicated across a semiconductor wafer, such as shown in FIG. 3. The apparatus 50 includes a semiconductor material 55, a positive electrode 60, a via 65, a plurality of fingers 70 and a trunkline 75.

The semiconductor material 55 is not particularly limited and may be any material capable of converting light energy to electrical energy. For example, the semiconductor material 55 may be silicon, such as a p-type mono-crystalline silicon doped with gallium or boron or n-type mono-crystalline silicon doped with phosphorus.

The semiconductor material 55 is to absorb energy from an incoming photon and convert the energy to electrical energy in the form a current through a closed circuit from the positive electrode 60 to the frontside of the semiconductor material 55. In the present example, the semiconductor material 55 is a photovoltaic cell where an electric current is generated via the photoelectric effect. The current is collected by the positive electrode 60 on the backside of the semiconductor material 55 and from the frontside of the semiconductor material 55 via the plurality of fingers and the trunklines 75. In the present example, the apparatus shown at 50 may provide a voltage between the frontside and backside of about 0.675 volts and be able to generate a current density of about 41 mA/cm$^2$.

In the present example, the positive electrode 60 is disposed on the backside of the semiconductor material 55. The positive electrode 60 is to collect the current from the backside of the semiconductor material 55. In some examples, the positive electrode 60 may also serve as a positive contact pad in the electrical circuit.

The via 65 is a hole through the semiconductor material 55 to allow the backside of the semiconductor material 55 to connect to the frontside. Accordingly, the via 65 provides for the negative electrode disposed on the frontside the of semiconductor material 55 to connect with the electrical circuit using contacts disposed on the backside. The manner by which the via 65 is formed is not limited. In the present example, a wafer may be drilled as an initial processing steps using a laser. The hole may then be filled with a metallic paste as one of the final processing steps to form the via 65.

The negative electrode disposed on the frontside of the semiconductor material is not particularly limited and may include various patterns. The negative electrode is to contact the frontside surface of semiconductor material 55 to collect current for the electrical circuit. Since photons are to be absorbed by the frontside of the semiconductor material 55, it is to be appreciated by a person of skill with the benefit of this description that the negative electrode is to be designed to allow for as much light to pass through as possible. Since the negative electrode is generally made from a non-transparent metal, such as silver, it is to be appreciated that the footprint of the negative electrode is to be reduced to allow more photons to pass through to the semiconductor material 55. However, by reducing the footprint of the negative electrode, the current density increases, which results in the increase of parasitic resistance in the electrical circuit.

In the present example, the negative electrode includes a plurality of fingers 70 and at least one trunkline 75. The plurality of fingers 70 are to collect current from different portions of the frontside of the semiconductor material 55. The plurality of fingers 70 are fine lines of conductive material, such as silver, to allow for as much light to pass around them as possible where the light is to be converted to electrical energy collected by the fingers 70. Current generated in portions of the semiconductor material 55 proximate to a finger 70 are carried to a trunkline 75 which is electrically connected to multiple fingers 70. Accordingly, the trunkline 75 collects current from an area of the frontside of the semiconductor material 55 and carries the current to the via 65 where the current is transferred to the backside of the semiconductor material 55 through the via 65. The positive electrode 60 and the negative electrode (through the via 65) may then be connected to form the electrical circuit at the backside of the semiconductor material 55.

In the present example, the trunkline 75 includes a varying structure to maintain the current density as more current is collected from additional fingers 70 along the length of the trunkline 75 toward the via 65. In particular, the trunkline 75 increases its cross sectional area closer to the via 65. The manner which the trunkline 75 varies is not particularly limited. For example, the width of the trunkline 75 may decrease as a function of distance from the via 65 as shown in FIG. 1. In addition, the height of the trunkline 75 may decrease as a function of distance from the via 65 as shown in FIG. 2B. By increasing the cross sectional area of the trunkline 75 closer to the via 65, additional current added to the trunkline 75 from fingers 70 will be offset by the increase in cross sectional area such that the current density remains substantially constant. By maintaining the current density along the length of the trunkline 75, bottlenecks caused by an increase in parasitic resistance in the electrical pathway is reduced.

It is to be appreciated by a person of skill with the benefit of this description that the variation of the cross section area of the trunkline 75 as a function of distance from the via 65 is not particularly limited. In particular, the current density in the trunkline 75 may be dependent on the pattern of the fingers 70 and the amount of current each finger 70 adds to the trunkline 75. For example, the variation of the cross section of the trunkline 75 as a function of distance from the via 65 may be non-linear. In some examples, the function may be a parabolic function.

In the present example, the pattern of the negative electrode is designed as shown in FIG. 1 to reduce the pathway distance to the via 65 from any point on the frontside of the semiconductor material 55. In particular, the plurality of fingers 70 may be oriented at an angle relative to a respective trunkline 75, such as about 45 degrees. Furthermore, the size of the apparatus 50 is not particularly limited and may be dimensioned to fit as a unit of a repeating pattern on a wafer of any size.

Referring to FIG. 3, a solar cell 100 to convert light energy to electrical energy is shown. In the present example, the solar cell 100 includes a plurality of apparatuses 50, which are repeating units of the solar cell 100. The size of the solar cell 100 is not particularly limited. For example, the solar cell 100 may be formed with 36 apparatuses 50 arranged in a 6×6 grid pattern on a full square or pseudo-square 158.75 mm wafer.

Figure 4:
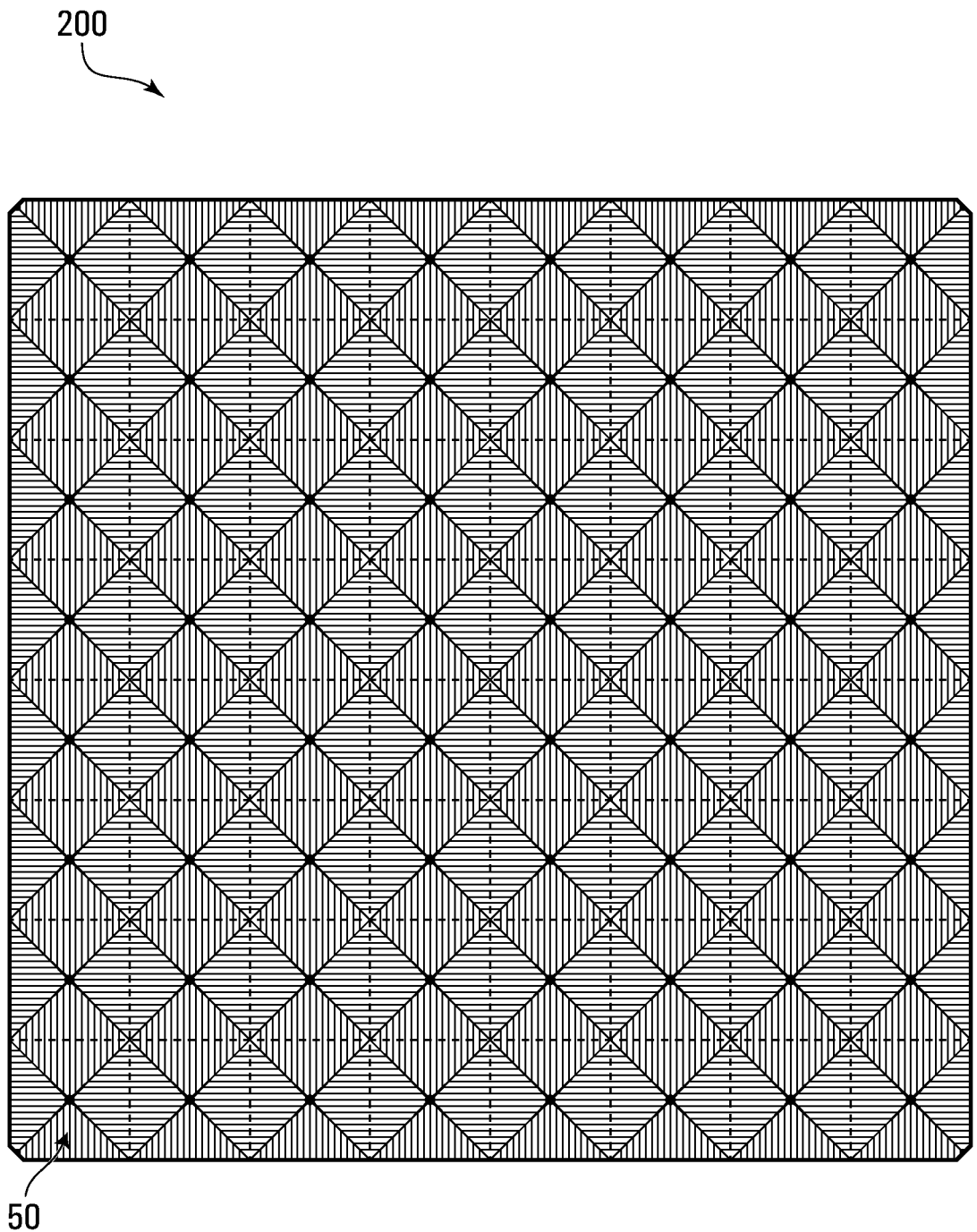
FIG. 4 is a view of a frontside of another example of a semiconductor wafer with multiple iterations of the apparatus shown in FIG. 1.

Referring to FIG. 4, another solar cell 200 to convert light energy to electrical energy is shown. In the present example, the solar cell 200 includes a plurality of apparatuses 50, which are repeating units of the solar cell 200. The size of the solar cell 200 is not particularly limited. For example, the solar cell 200 may be formed with 64 apparatuses 50 arranged in an 8×8 grid pattern on a full square or pseudo-square 166 mm wafer.

Figure 5:
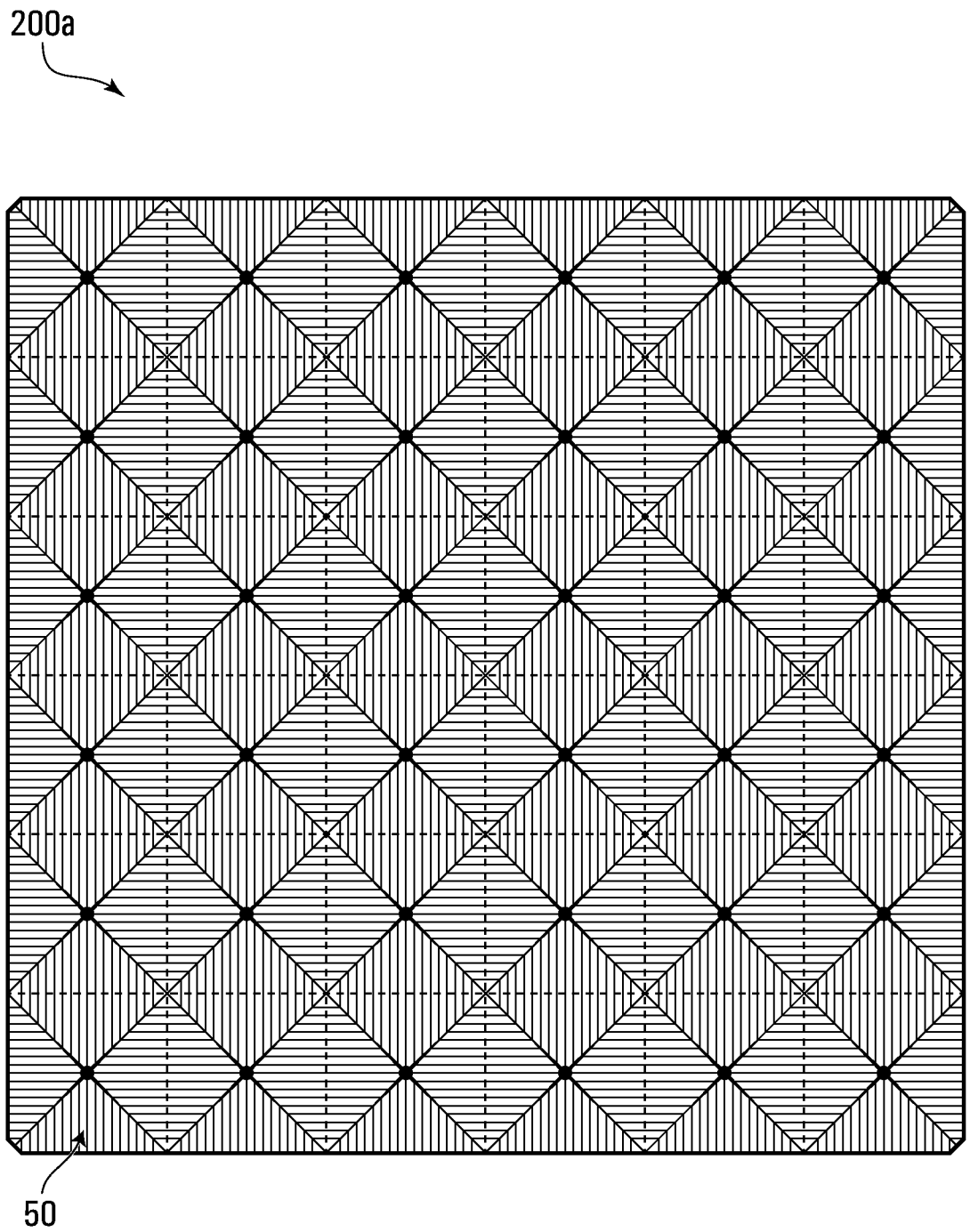
FIG. 5 is a view of a frontside of another example of a semiconductor wafer with multiple iterations of the apparatus shown in FIG. 1.

Referring to FIG. 5, another solar cell 200a to convert light energy to electrical energy is shown. In the present example, the solar cell 200a includes a plurality of apparatuses 50, which are repeating units of the solar cell 200a. The size of the solar cell 200a is not particularly limited. For example, the solar cell 200a may be formed with 36 apparatuses 50 arranged in an 6×6 grid pattern on a full square or pseudo-square 166 mm wafer.

Figure 6:
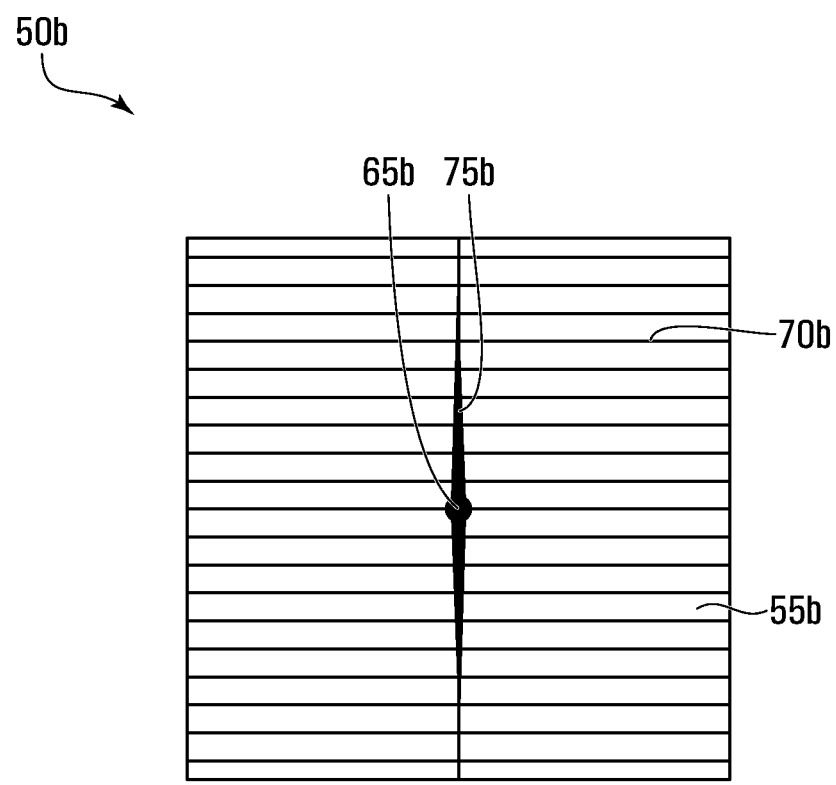
FIG. 6 is a view of another example of an apparatus to convert light energy to electrical energy.

Referring to FIG. 6, another example of an apparatus 50b to convert light energy to electrical energy is shown. Like components of the apparatus 50b bear like reference to their counterparts in the apparatus 50, except followed by the suffix "b". The apparatus 50b may be part of a larger cell with a plurality of vias 65b to convert light energy. The apparatus 50b includes a semiconductor material 55b, a positive electrode (not shown), a via 65b, a plurality of fingers 70b and a trunkline 75b.

In this example, the fingers 70b are perpendicular the trunkline 75b. As illustrated, the width of the trunkline 75b increases based on the number of fingers 70b that feed into the trunkline 75b as a function of the distance from the via 65b. In this example, it is to be appreciated that each finger 70b is to collect a substantially equivalent amount of current. Accordingly, since the current added to the trunkline 75b increases in a substantially linear manner toward the via 65b, it is to be appreciated by a person of skill with the benefit of this description that the variation of the cross section of the trunkline 75b as a function of distance from the via 65b may be linear.

Figure 7:
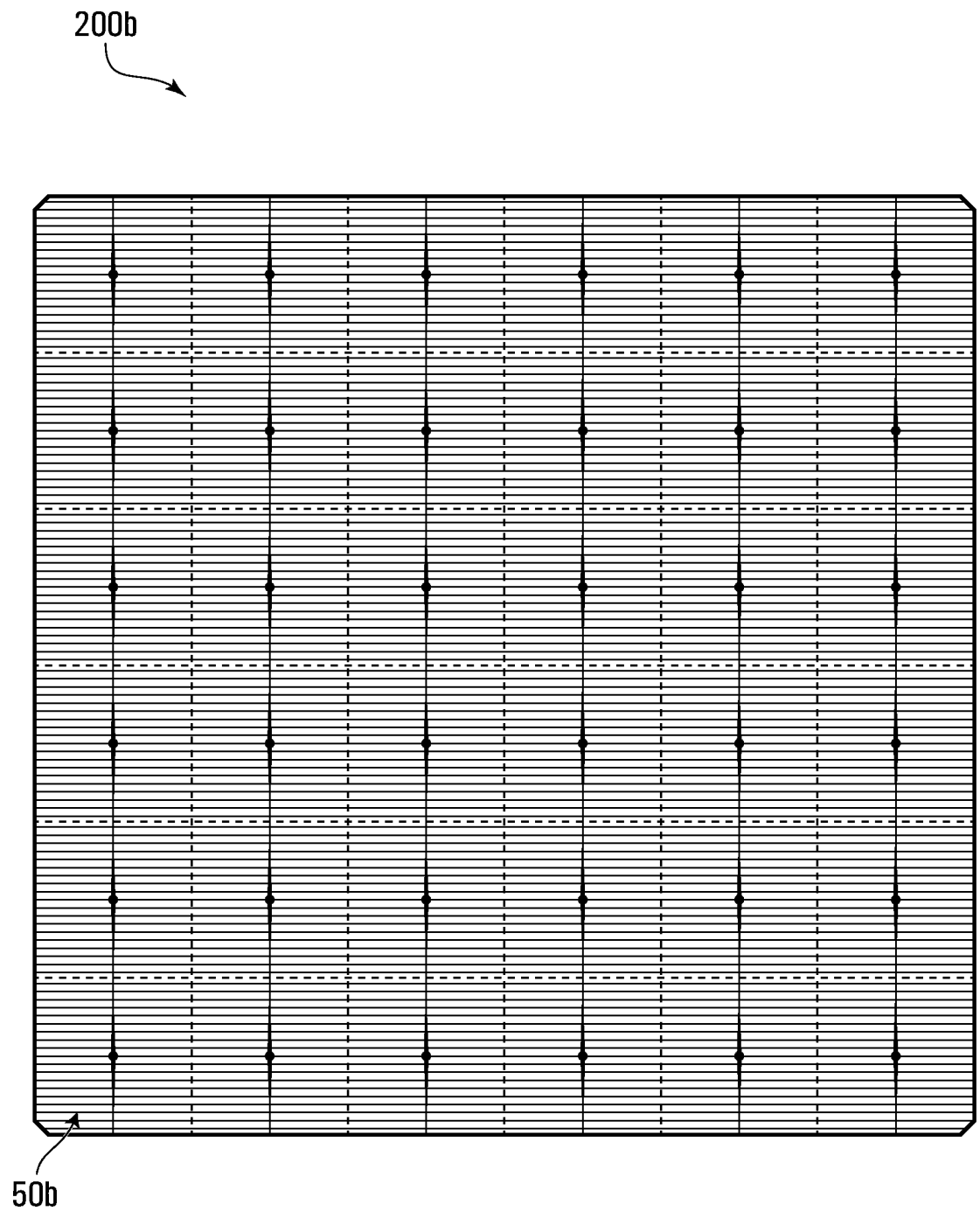
FIG. 7 is a view of a frontside of an example of a semiconductor wafer with multiple iterations of the apparatus shown in FIG. 6.

Referring to FIG. 7, a solar cell 200b to convert light energy to electrical energy is shown. In the present example, the solar cell 200b includes a plurality of apparatuses 50b, which are repeating units of the solar cell 200b. The size of the solar cell 200b is not particularly limited. For example, the solar cell 200b may be formed with 36 apparatuses 50b arranged in a 6×6 grid pattern on a full square or pseudo-square 166 mm wafer.

Figure 8:
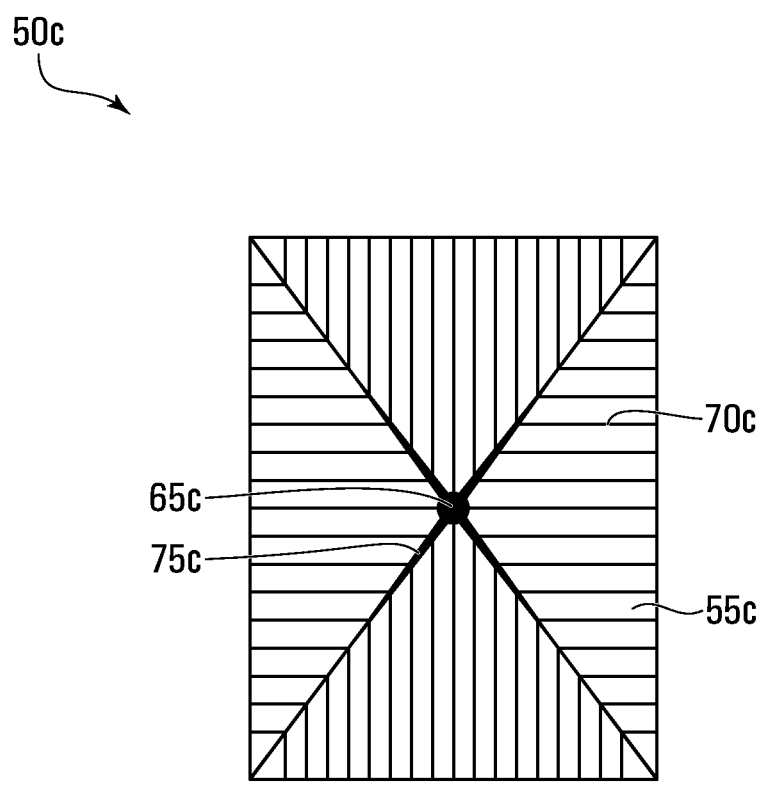
FIG. 8 is a view of another example of an apparatus to convert light energy to electrical energy.

Referring to FIG. 8, another example of an apparatus 50c to convert light energy to electrical energy is shown. Like components of the apparatus 50c bear like reference to their counterparts in the apparatus 50, except followed by the suffix "c". The apparatus 50c may be part of a larger cell with a plurality of vias 65c to convert light energy. The apparatus 50c includes a semiconductor material 55c, a positive electrode (not shown), a via 65c, a plurality of fingers 70c and a trunkline 75c.

In this example, the apparatus 50c is an elongated version of the apparatus 50. In this example, the cross section area of the trunkline 75c varies in a manner that is not particularly limited. For example, the width of the trunkline 75c may decrease as a function of distance from the via 65. Alternatively, or in combination with varying the width, the height of the trunkline 75c may decrease as a function of distance from the via 65c. By increasing the cross sectional area of the trunkline 75c closer to the via 65c, additional current added to the trunkline 75c from fingers 70c will be offset by the increase in cross sectional area such that the current density remains substantially constant.

It is to be appreciated by a person of skill with the benefit of this description that the variation of the cross section area of the trunkline 75b as a function of distance from the via 65b is not particularly limited. In particular, the current density in the trunkline 75b may be dependent on the pattern of the fingers 70b and the amount of current each finger 70b adds to the trunkline 75b. For example, the variation of the cross section of the trunkline 75b as a function of distance from the via 65b may be a parabolic function.

Figure 9:
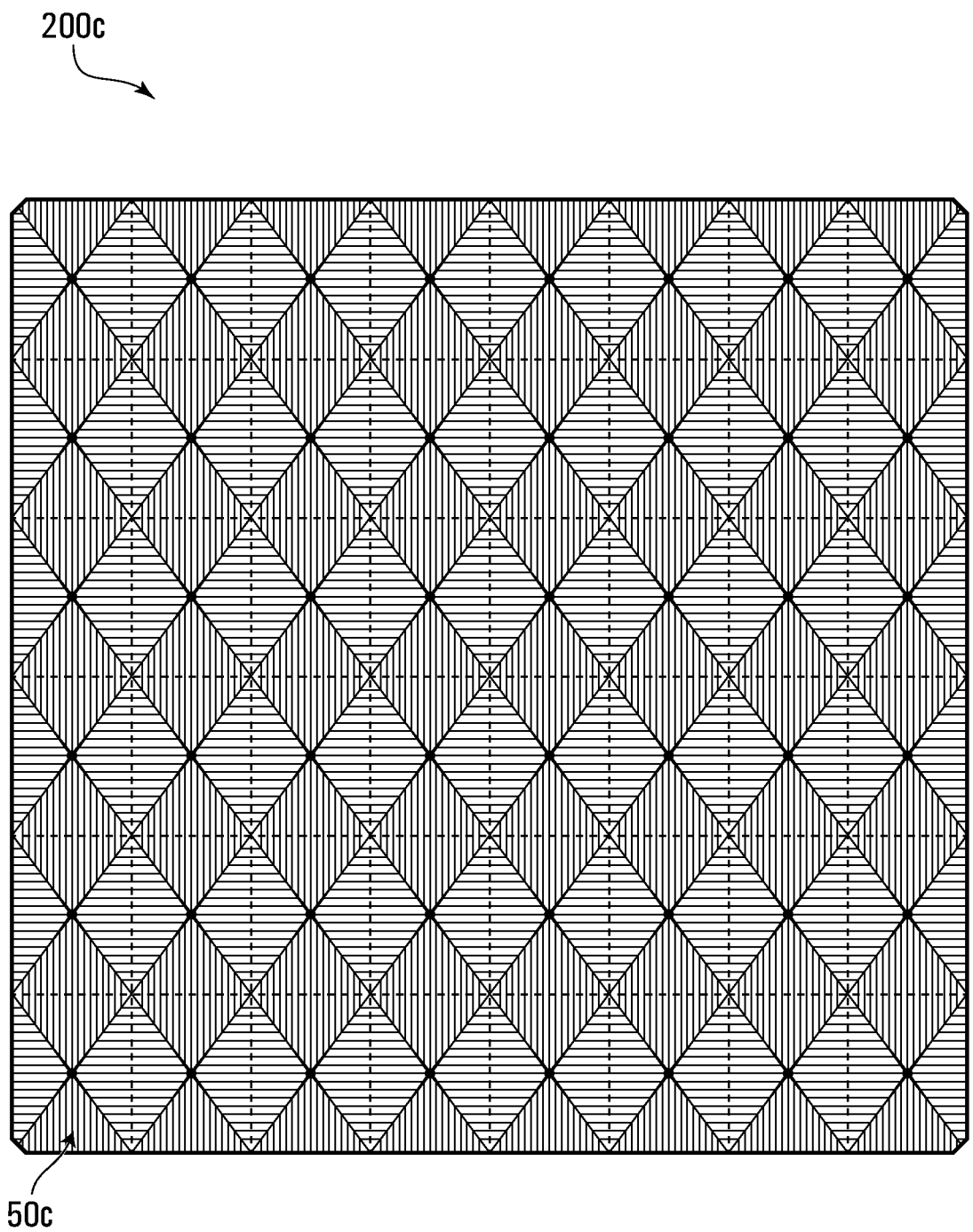
FIG. 9 is a view of a frontside of an example of a semiconductor wafer with multiple iterations of the apparatus shown in FIG. 8.

Referring to FIG. 9, another solar cell 200c to convert light energy to electrical energy is shown. In the present example, the solar cell 200c includes a plurality of apparatuses 50c, which are repeating units of the solar cell 200c. The size of the solar cell 200c is not particularly limited. For example, the solar cell 200c may be formed with 48 apparatuses 50 arranged in a 6×8 grid pattern on a full square or pseudo-square 166 mm wafer.

Figure 10:
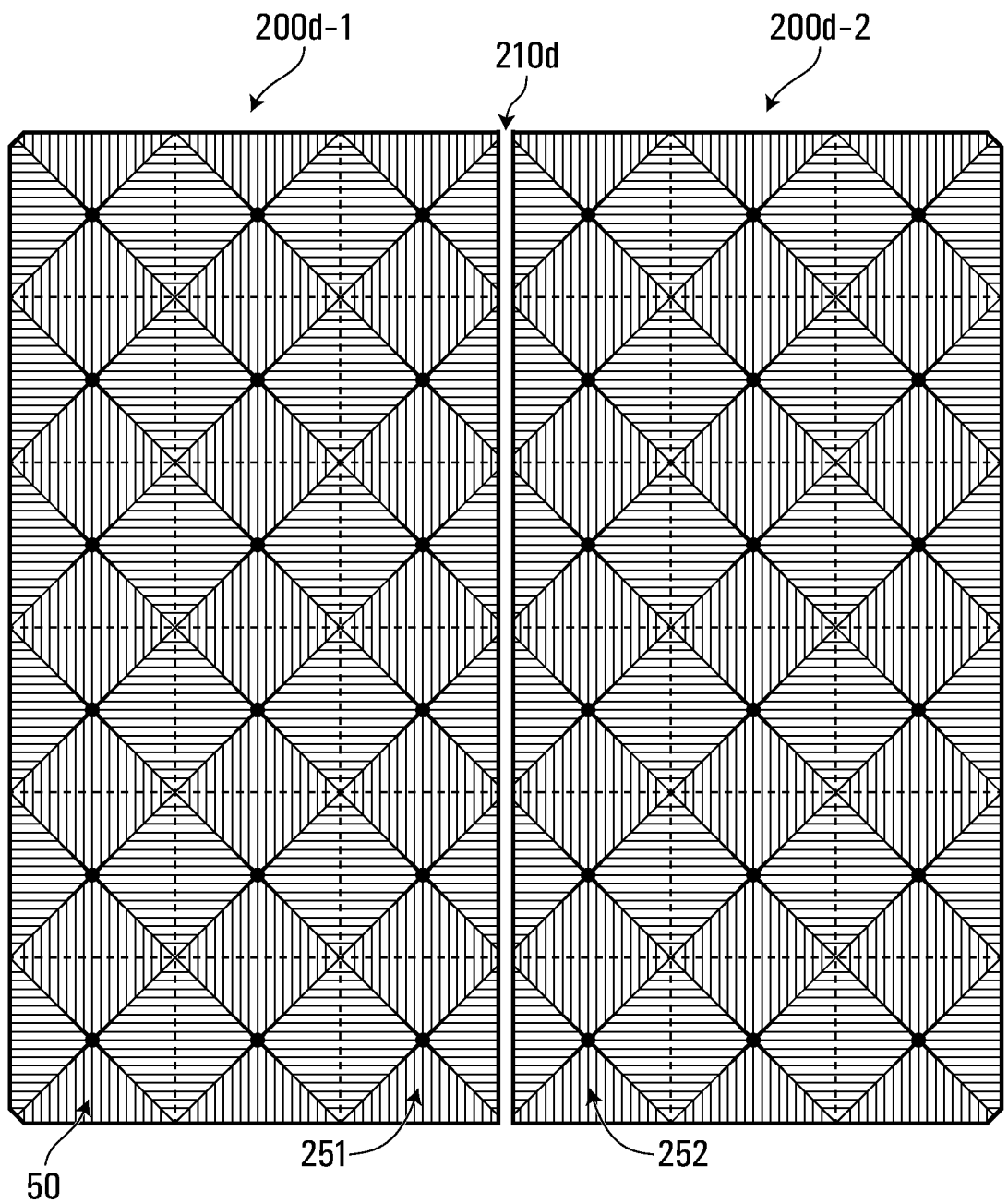
FIG. 10 is a view of a frontside of another example of a semiconductor wafer with multiple iterations of the apparatus shown in FIG. 1 and a break.

Referring to FIG. 10, an example of solar cells 200d-1 and 200d-2 (generically, these solar cells are referred to herein as "solar cells 200d" and collectively they are referred to as "solar cells 200d") to convert light energy to electrical energy are shown. In the present example, the solar cells 200d may include a plurality of apparatuses 50, which are repeating units on each solar cell 200d. The size of the solar cells 200d are not particularly limited. For example, the solar cells 200d may be formed on a full square or pseudo-square 166 mm wafer. In the present example, the solar cell 200d-1 includes 12 apparatuses 50 arranged and six apparatuses 251 disposed along the gap 210d. The solar cell 200d-2 is substantially a mirror image of the solar cell 200d-1 and includes 12 apparatuses 50 arranged and six apparatuses 252 disposed along the gap 210d. The manner by which the solar cells 200d are formed is not particularly limited. In the present example, a pattern of 36 apparatuses 50 arranged in a 6×6 grid pattern on a full square or pseudo-square wafer may be screen printed through mask having an additional break in the center of the solar cell. The screen print mask is subsequently removed to form the gap 210d and an electrical break between the solar cells 200d. Accordingly, the apparatuses 251 and the apparatuses 252 along the gap 210d are asymmetrical. The width of the gap 210d is not particularly limited. In the present example, the gap 210d is about 2 mm. However, in other examples, the gap 210d may be wider or narrower.

It is to be appreciated by a person of skill with the benefit of this description that the gap 210d may be provided to accommodate cutting to separate the solar cells 200d. The cutting line is to be along the gap 210 where no fingers or gridlines are present. This facilitates cutting by allowing for a laser or another cutting process to occur without obstruction to provide for a cleaner cut.

Figure 11:
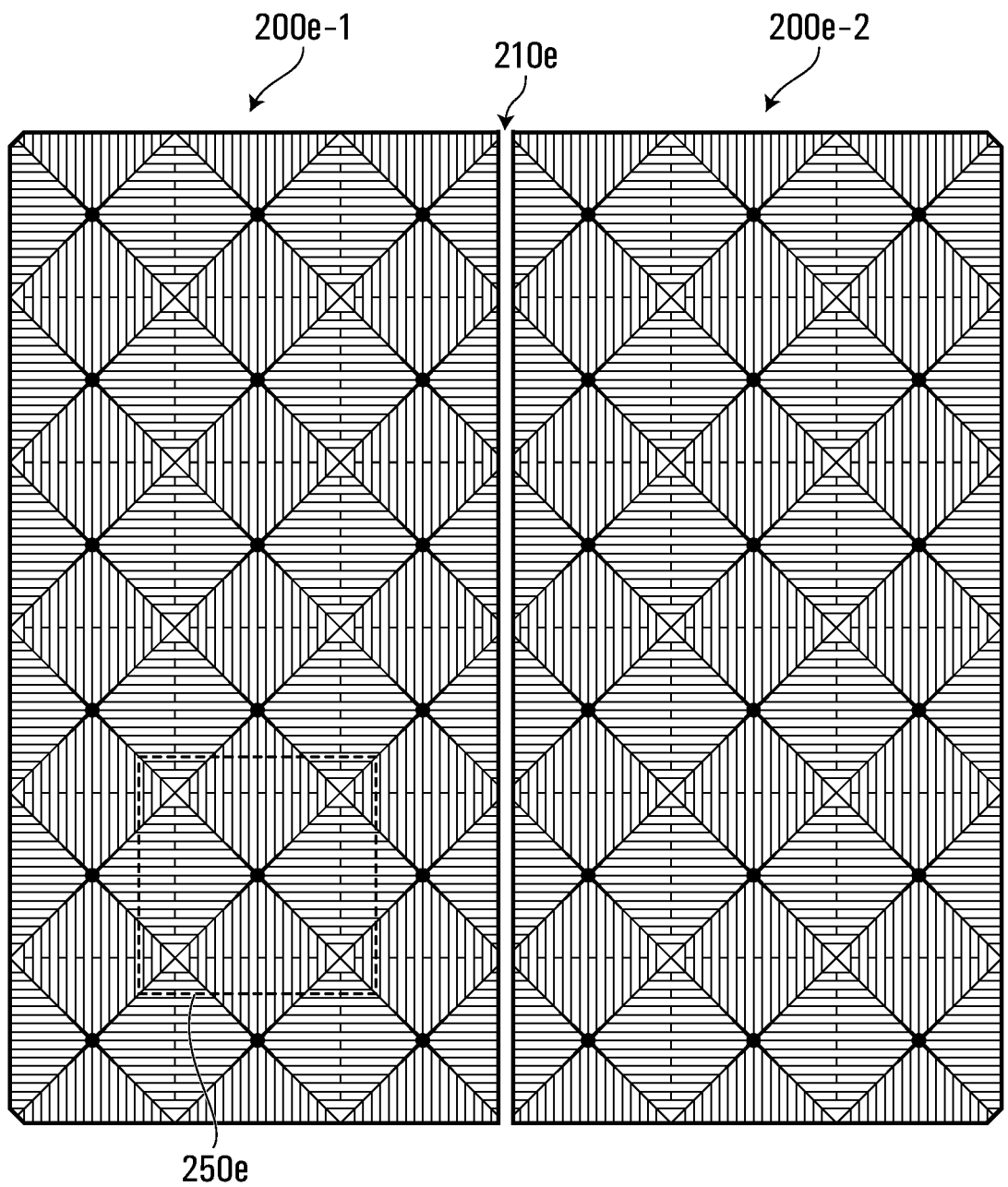
FIG. 11 is a view of a frontside of another example of a semiconductor wafer with multiple iterations of another example apparatus with additional connectors.

Referring to FIG. 11, another example of solar cells 200e-1 and 200e-2 (generically, these solar cells are referred to herein as "solar cells 200e" and collectively they are referred to as "solar cells 200e") to convert light energy to electrical energy are shown. Like components of the solar cells 200d bear like reference to their counterparts in the solar cells 200d, except followed by the suffix "e". For example, the solar cells 200d are separated by a gap 210e.

Figure 12:
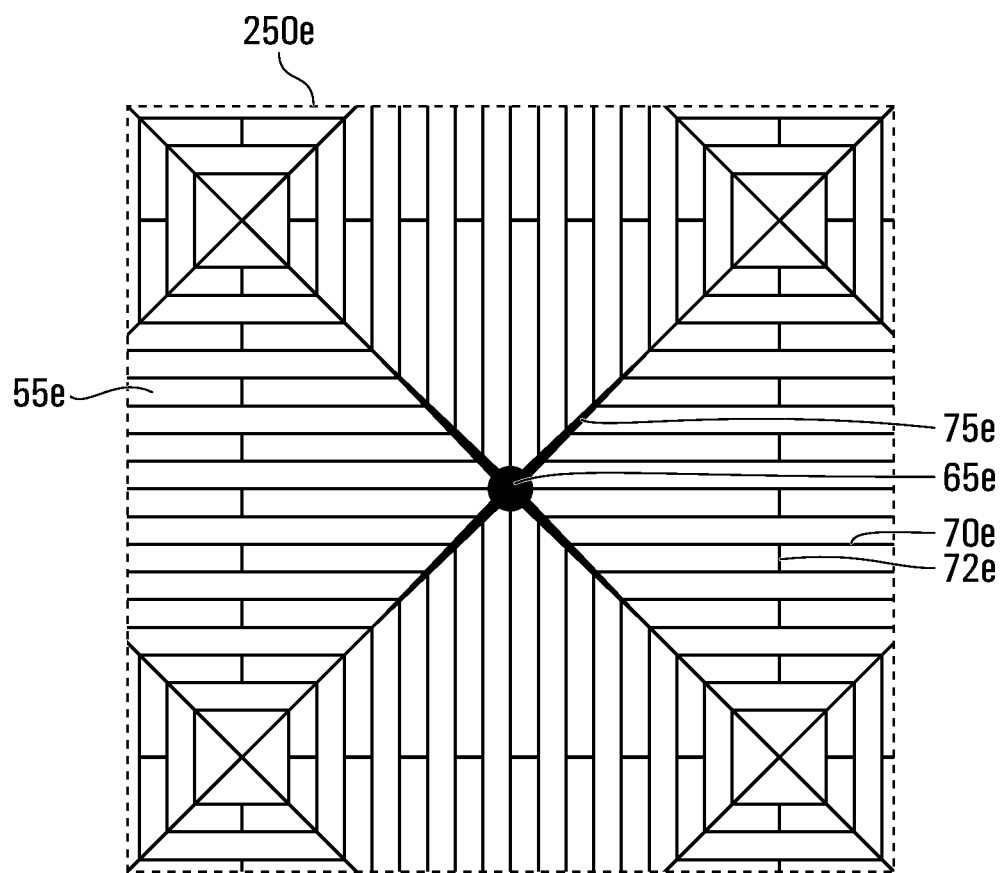
FIG. 12 is a detailed view of a portion of the frontside of the example of a semiconductor wafer shown in FIG. 11.

Referring to FIG. 12, a portion 250e of the solar cells 200e are shown in greater detail. In the present example, the portion 250e a repeating unit and the surrounding area of each repeating unit. The portion 250e includes a semiconductor material 55e, a positive electrode (not shown), a via 65e, a plurality of fingers 70e, a connector 72e, and a trunkline 75e.

In the present example, the repeating unit is substantially the same as the apparatus 50 with the addition of the connectors 72e. It is to be appreciated by a person of skill with the benefit of this description that the connectors 72e increased the redundancy of the solar cell 200e by connecting adjacent fingers 70e. In particular, the connectors 72e reduce the impact of manufacturing defects in the metallization, such as small gaps, by providing alternative pathways for the current collected from the frontside of the semiconductor material 55e to reach the trunkline 75e. The placement of the connectors 72e as well as the number of connectors 72e disposed on the semiconductor material 55 is not particularly limited. It is to be appreciated by a person of skill with the benefit of this description that additional connectors 72e will provide additional redundancy against defects. However, each additional connector 72e will increase the shading of the semiconductor material 55e.

Figure 13:
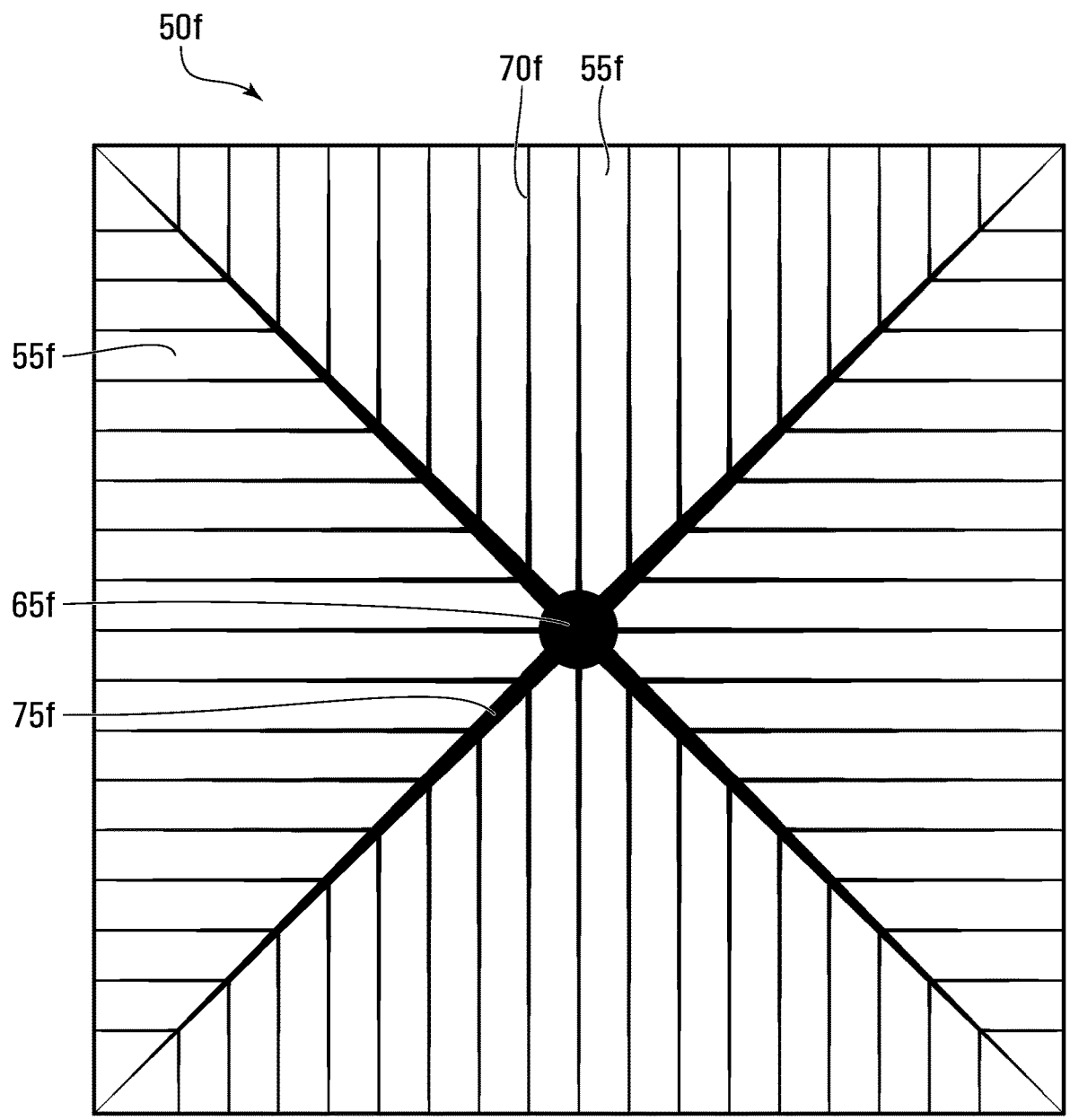
FIG. 13 is a view of another example of an apparatus to convert light energy to electrical energy.

Referring to FIG. 13, another example of an apparatus 50f to convert light energy to electrical energy is shown. Like components of the apparatus 50f bear like reference to their counterparts in the apparatus 50, except followed by the suffix "f". The apparatus 50f may be part of a larger cell with a plurality of vias 65f to convert light energy. The apparatus 50f includes a semiconductor material 55f, a positive electrode (not shown), a via 65f, a plurality of fingers 70f and a trunkline 75f.

In this example, the apparatus 50f includes fingers 70f that are tapered to increase the cross section area of the finger 70f as it approaches the trunkline 75f. The manner by which the fingers 70f taper is not particularly limited. The tapering away from the trunkline 75f results in an increase in the width of the finger 70f as it approaches the trunkline 75f. In the present example, the height of the finger 70f above the semiconductor material 55f is substantially constant. Accordingly, the increase in width approaching the trunkline 75f will result in an increase in cross section area of the finger 70f. Since the current added to the finger 70f increases in a substantially linear manner toward the trunkline 75f, the corresponding increase in the cross section area of the finger 70f closer to the trunkline 75f maintains a current density throughout the length of the finger 70f that is substantially constant to reduce the parasitic resistance within each finger 70f.

It is to be understood that variations are contemplated. For example, the apparatus 50 is not particularly limited in size and may have various dimensions to fit a targeted number of units on a wafer of any size. When varying the size of the apparatus 50, additional fingers 70 may be added to each apparatus 50 to provide effective collection of current from the frontside of the semiconductor material 55. As another example of a variation, it is to be appreciated by a person of skill that each wafer may have a combination of different apparatuses, such as a mixture of apparatus 50 and apparatus 50b.

Various advantages will become apparent to a person of skill in the art with the benefit of this description. For example, the metallization pattern of the negative electrode show in the various examples may be used improve performance without resorting to other means such as by using more costly materials to reduce parasitic resistance, such as silver, or by adding more vias, which introduces a significant cost such as reduced throughput, higher capital expenditure, and additional potential points of failure (i.e. more defect sites for shunts or cell cracks).

It is to be recognized that features and aspects of the various examples provided above may be combined into further examples that also fall within the scope of the present disclosure.

What is claimed is:

1. An apparatus comprising:
   a semiconductor material to absorb energy from a photon, wherein the energy is to be converted to a current;
   a positive electrode disposed on a backside of the semiconductor material to collect the current from the backside;
   a via to connect the backside of the semiconductor material electrically to a frontside of the semiconductor material;
   a plurality of fingers disposed on the frontside of the semiconductor material to collect the current from the frontside; and
   a trunkline connected to the plurality of fingers to deliver the current to the via, wherein the trunkline increases a cross-sectional area toward the via to reduce parasitic resistance, wherein a variation of the cross-sectional area maintains a substantially constant current density in the trunkline, wherein the cross-sectional area varies as a non-linear function with distance from the via, and wherein the non-linear function is parabolic.

2. The apparatus of claim 1, wherein a finger of the plurality of fingers increases a finger cross-sectional area toward the trunkline to reduce parasitic resistance.

3. The apparatus of claim 2, wherein a variation of the finger cross-sectional area maintains a substantially constant current density in the finger.

4. The apparatus of claim 3, wherein the finger cross-sectional area varies as a finger non-linear function with distance from the trunkline along the finger.

5. The apparatus of claim 4, wherein the finger non-linear function is parabolic.

6. The apparatus of claim 1, wherein the plurality of fingers are disposed in a pattern to reduce a pathway distance to the via.

7. The apparatus of claim 6, wherein the pattern includes each finger of the plurality of fingers disposed at an angle relative to the trunkline.

8. The apparatus of claim 7, wherein the angle is about 45 degrees.

9. The apparatus of claim 1, further comprising a plurality of connectors between adjacent fingers in the plurality of fingers to increase redundancy.

\* \* \* \* \*